(12) United States Patent
Ataee et al.

(10) Patent No.: US 8,264,210 B2
(45) Date of Patent: Sep. 11, 2012

(54) INTERFACE TO REGULATE VOLTAGE FOR ASIC POWER MANAGEMENT

(75) Inventors: Mehran Ataee, Cupertino, CA (US); Udupi Harisharan, Fremont, CA (US); Jun Qian, San Jose, CA (US); Thomas A. Hamilton, Milpitas, CA (US); Senthil Somasundaram, Sunnyvale, CA (US)

(73) Assignee: Cisco Technology, Inc., San Jose, CA (US)

( * ) Notice: Subject to any disclaimer, the term of this patent is extended or adjusted under 35 U.S.C. 154(b) by 321 days.

(21) Appl. No.: 12/249,589

(22) Filed: Oct. 10, 2008

(65) Prior Publication Data

US 2010/0090743 A1 Apr. 15, 2010

(51) Int. Cl.
*G05F 1/00* (2006.01)
*H03L 5/00* (2006.01)
(52) U.S. Cl. ........................ 323/266; 327/306
(58) Field of Classification Search .......... 327/306, 327/538, 540; 323/234, 266, 267, 272, 282, 323/283; 713/300
See application file for complete search history.

(56) References Cited

U.S. PATENT DOCUMENTS

| | | | |
|---|---|---|---|
| 4,953,930 A * | 9/1990 | Ramsey et al. | 385/14 |
| 6,936,999 B2 | 8/2005 | Chapuis | |
| 6,949,916 B2 | 9/2005 | Chapuis | |
| 7,000,125 B2 | 2/2006 | Chapuis et al. | |
| 7,049,798 B2 | 5/2006 | Chapuis et al. | |
| 7,075,383 B2 * | 7/2006 | Adachi et al. | 332/127 |
| 7,401,241 B2 * | 7/2008 | Rotem et al. | 713/320 |
| 7,423,475 B2 * | 9/2008 | Saha et al. | 327/543 |
| 2005/0223251 A1 * | 10/2005 | Liepe et al. | 713/322 |
| 2005/0281057 A1 * | 12/2005 | Jung et al. | 363/15 |
| 2008/0185914 A1 * | 8/2008 | Randall | 307/64 |
| 2009/0121697 A1 * | 5/2009 | Aiura et al. | 323/286 |
| 2010/0019834 A1 * | 1/2010 | Zerbe et al. | 327/538 |

\* cited by examiner

*Primary Examiner* — Adolf Berhane
*Assistant Examiner* — Emily Pham

(57) ABSTRACT

A method and apparatus to regulate voltage used to power an ASIC comprising an ASIC having a signal source and a modulator. The modulator establishes a characteristic of a signal created by the signal source to indicate a voltage level to be used to power the ASIC. The signal is communicated to a voltage regulator to apply an optimal voltage to the ASIC.

23 Claims, 3 Drawing Sheets

INTERFACE TO REGULATE VOLTAGE FOR ASIC POWER MANAGEMENT

BACKGROUND

1. Field of the Invention

Embodiments of the present invention generally relate to power management techniques and, more particularly, to an apparatus and method to regulate voltage for Application Specific Integrated Circuit (ASIC) power management.

2. Description of the Related Art

Application Specific Integrated Circuits (ASIC) are widely used in electronics. An ASIC is powered by a DC-DC regulator. Typically, the regulator has a fixed output voltage level that is coupled via a "rail" (i.e., power bus) to the ASIC. The ASIC operating efficiency is dependent upon the voltage level i.e., the amount of power consumed by the ASIC depends on the voltage level. If the selected fixed voltage level is above or below an optimal voltage level for the ASIC, the ASIC operates efficiently and consumes more power than necessary. On a given circuit card, such as a line card, there may be about 40 regulators and as many ASICs. As a result, an inefficient operation can result in large power consumption.

Current voltage regulation techniques that attempt to optimize the voltage level utilize Voltage Identifier (VID) bits. Such technology uses 8 parallel lines to communicate the VID bits to a regulator, or a controller for the regulator. As a result, if one or more bits are bad or corrupt, the regulator will not be able to accurately regulate the voltage. Using 8 parallel lines also occupies a substantial area on the circuit board.

In other solutions a third integrated circuit (IC) is used to fetch information from the ASIC. During ASIC fabrication, the optimal operating voltage is measured and stored as digital information in the ASIC. The stored digital information is accessed by a third IC circuit. The third IC converts the digital information to an analog DC level that is coupled to the regulator as a reference level. This solution requires a third IC that adds complexity and consumes circuit card area. The additional IC and the communications necessary to couple the IC to both the regulator and the ASIC is not capable of use on circuit cards having many ASICs. For example, a line card for a DC3 application having 40 regulator and ASIC pairs does not have the space to support 40 additional ICs.

Accordingly, there is a need in the art for method and apparatus to provide ASIC power management.

BRIEF DESCRIPTION OF THE DRAWINGS

So the manner in which the above recited features are attained and can be understood in detail, a more detailed description is described below with reference to Figures illustrated in the appended drawings.

The Figures in the appended drawings, like the detailed description, are examples. As such, the Figures and the detailed description are not to be considered limiting, and other equally effective examples are possible and likely. Furthermore, like reference numerals in the Figures indicate like elements, and wherein.

DESCRIPTION OF EXAMPLE EMBODIMENTS

Overview

A method and apparatus for regulating voltage applied to an Application Specific Integrated Circuit (ASIC) is disclosed. In one embodiment, the apparatus comprises an ASIC having a signal source and a modulator. The modulator establishes a characteristic of a signal created by the signal source to indicate a voltage level to be used to power the ASIC.

In another embodiment, the method of operating an ASIC comprises applying a first voltage level to the ASIC, and sending a repeating signal from the ASIC to a voltage regulator. The repeating signal has a characteristic for identifying a second voltage level. The method further includes adjusting the first voltage level to the second voltage level in response to the characteristic.

DETAILED DESCRIPTION

Figure 1:
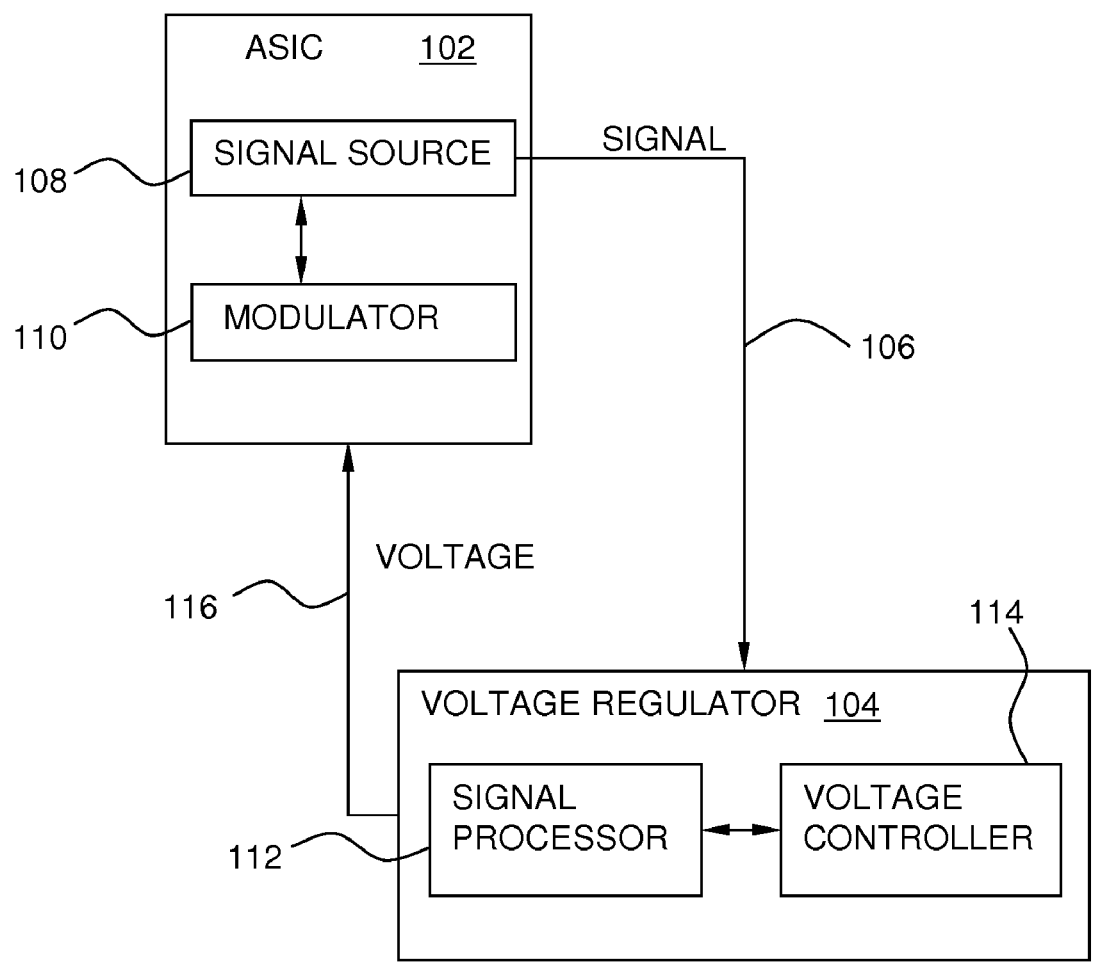
FIG. 1 depicts a block diagram of an apparatus to regulate voltage for an ASIC, in accordance with at least one embodiment of the invention.

FIG. 1 is a block diagram of an apparatus 100 to regulate voltage for an Application Specific Integrated Circuit (ASIC) in accordance with at least one embodiment of the invention. The apparatus 100 includes an ASIC 102 and a voltage regulator 104 operatively coupled to each other via a conductor 106. Further, the apparatus 100 includes a power bus 116 from which the ASIC 102 is powered.

The ASIC 102 includes a signal source 108 and a modulator 110 operatively coupled to each other via various support circuits. As described below, the modulator 110 establishes a specific characteristic of a signal produced by the signal source 108, where the characteristic is indicia of the optimal voltage level for operating the ASIC 102. The various support circuits facilitate the operations and communication between the signal source 108 and the modulator 110.

The voltage regulator 104 is a device used to regulate and maintain a constant voltage on the power bus 116. The voltage regulator 104 includes a signal processor 112 and a voltage controller 114 operatively coupled to each other via various support circuits. The various support circuits facilitate the operation and communication between the signal processor 112 and the voltage controller 114.

In one embodiment, the signal source 108 generates a repeating signal, e.g., an oscillatory signal such as square wave, sine wave or the like. The signal source 108 communicates the repeating signal to the voltage regulator 104 via the conductor 106.

In this particular embodiment of the invention, the conductor 106 comprises a single conductive path with capability to propagate a signal from the ASIC 102 to the voltage regulator 104. In one embodiment, the conductor 106 carries the signal produced by the signal source 108 from the ASIC 102 to the voltage regulator 104.

According to various embodiments of the present invention, the modulator 110 is any device that performs modulation, such as a phase modulation, a frequency modulation, an amplitude modulation among others. The modulation may be static (time invariant) or dynamic (time variant). In one embodiment, the modulator 110 sets a static modulation that establishes at least one characteristic (for example, frequency, duty cycle, and the like) of the repeating signal generated by the signal source 108. This signal characteristic is indicative of the required voltage used to optimally power the ASIC 102.

The required voltage for the ASIC 102 is determined during ASIC manufacturing. Once the optimal voltage is known, the ASIC is encoded with the information using such techniques as "blown fuses" (also known as hardwiring) or storing the information in ASIC memory (e.g., an Electric Erasable Programmable Read Only Memory (EEPROM)). This information is used to establish the modulation and define the signal characteristic.

In one embodiment, the signal processor 112 is a circuit capable of processing and analyzing the signal sent from the ASIC 102. The signal processor 112 analyzes the signal characteristic to determine an optimal voltage level for the operation of the ASIC 102. In response to the analysis, the voltage controller 114 adjusts the voltage level applied to the ASIC 102 for optimal power dissipation.

The power bus 116 is any bus that couples the voltage level from the voltage regulator 104 to the ASIC 102.

Figure 2:
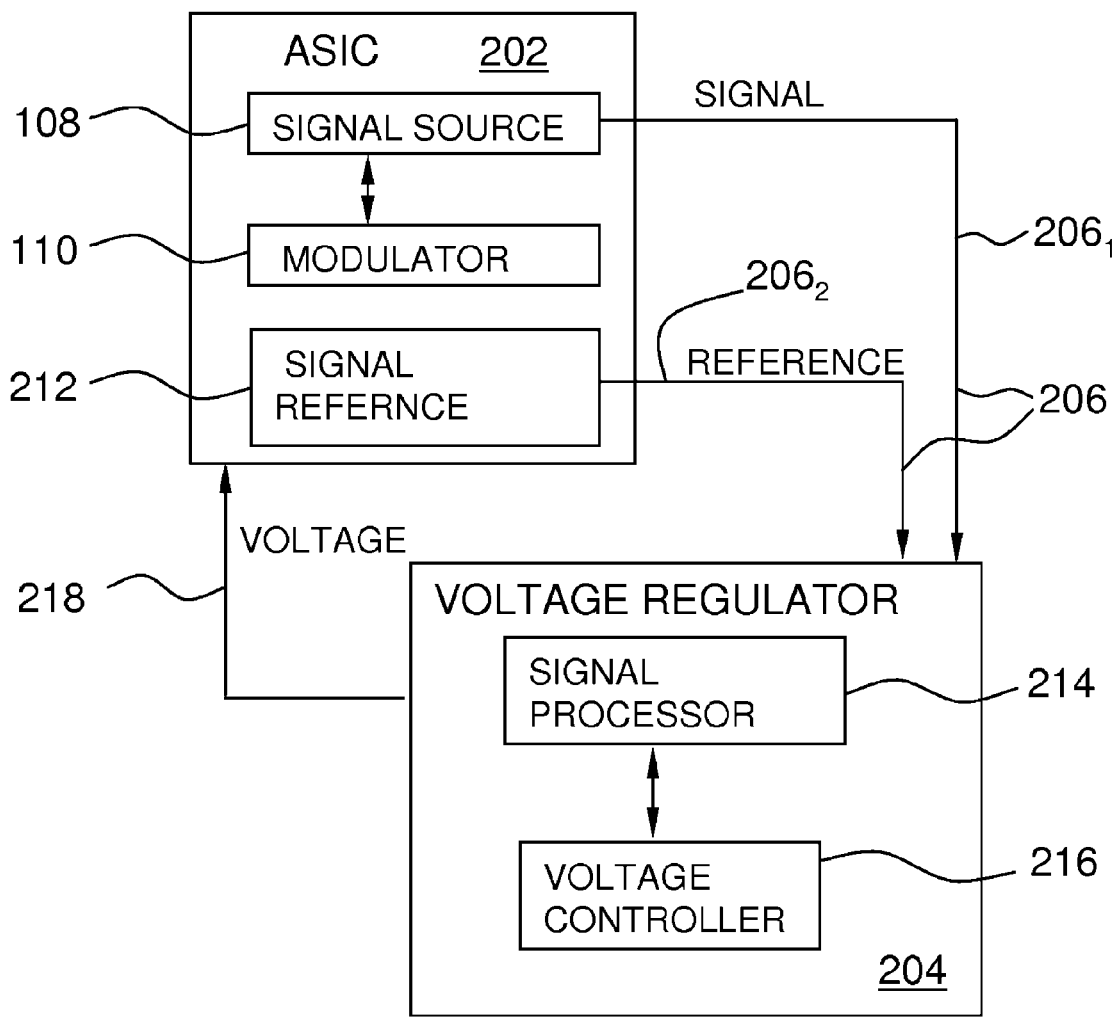
FIG. 2 is a block diagram of an apparatus to regulate voltage for an ASIC using a reference signal, in accordance with at least one embodiment of the invention.

FIG. 2 is a block diagram of an alternative embodiment of an apparatus 200 to regulate voltage for an ASIC using a reference signal. The apparatus 200 includes an ASIC 202 and a voltage regulator 204 operatively coupled to each other via conductors 206. In this embodiment, a conductor pair is used to couple the modulated signal on path $206_1$ and a reference signal on path $206_2$. Further the apparatus 200 includes a power bus 218. The power bus 218 is similar to the power bus 116 of FIG. 1.

The signal source 108 and the modulator 110 are similar to the signal source 108 and the modulator 110 of FIG. 1. Further, the ASIC 202 comprises a signal reference 212.

The signal reference 212 provides a reference clock to the voltage regulator 204 to compensate for any time or frequency measurement error between the ASIC 202 and the voltage regulator 204 that may use two different time bases. As such, the reference is useful in accurately determining the characteristic of the signal.

In one embodiment, the signal processor 214 of voltage regulator 204 compares the signal (path $206_1$) with the reference clock (path $206_2$) to determine the signal characteristic indicative of a particular voltage level. The voltage regulator 204 produces the optimal voltage level for ASIC 202 in response to the signal characteristic.

Figure 3:
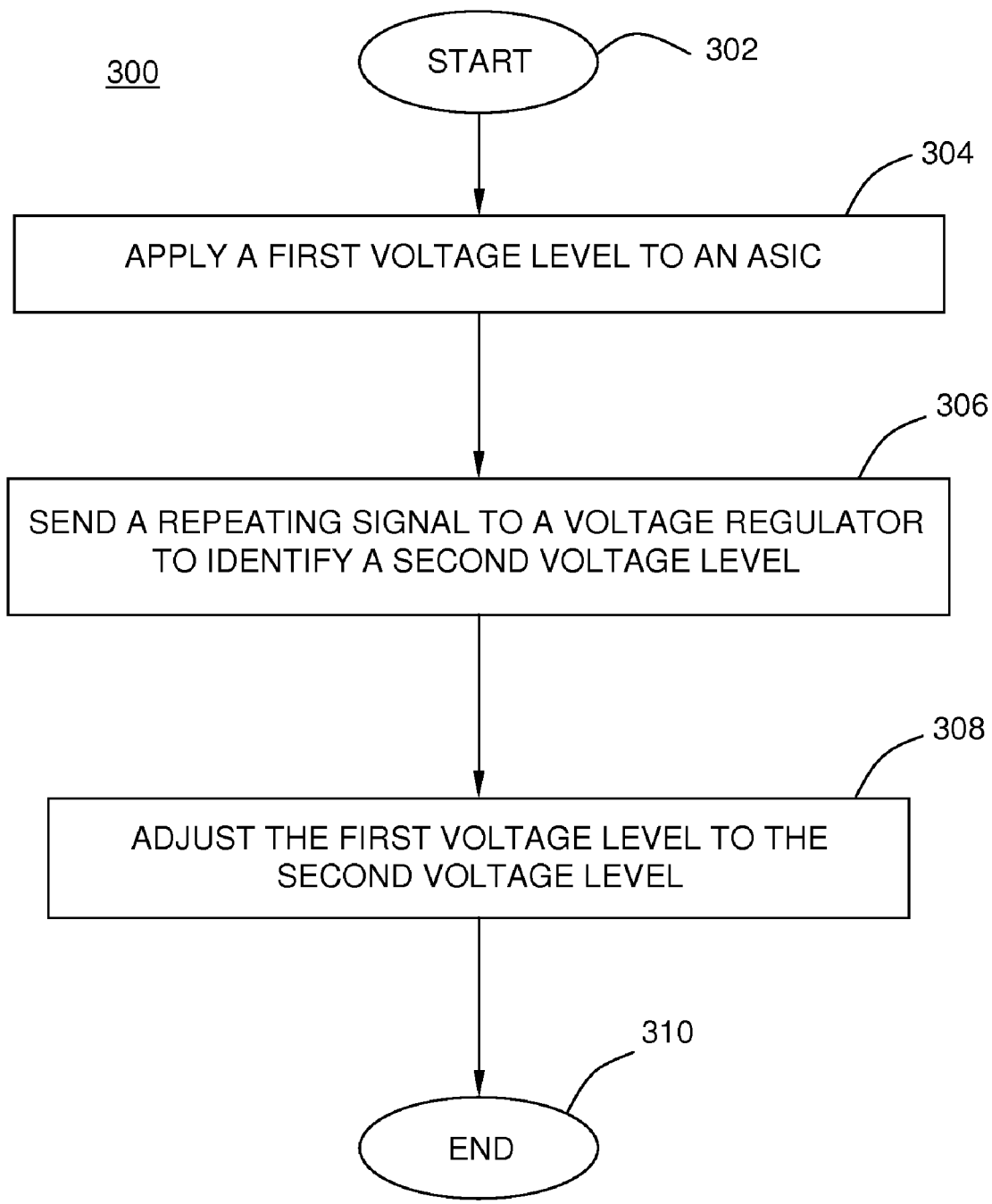
FIG. 3 is a flow diagram of a method for operating an ASIC, in accordance with at least one embodiment of the present invention.

FIG. 3 is a flow diagram of a method 300 for operating an ASIC in accordance with one embodiment of the invention. For convenience, the method 300 is described herein with respect to both of the architectures shown in FIGS. 1 and 2. The method 300 begins at step 302 and proceeds to step 304, at which a first voltage level is applied to an ASIC. A signal source generates a repeating signal. A modulator modulates and sets the characteristic or characteristics of the signal to indicate a voltage level to be established by a voltage regulator.

In one embodiment, a frequency of the signal may indicate the voltage level to be established. By the way of example and not as a limitation, the ASIC may provide a square wave, sinusoidal signal or some repeating signal with its frequency proportional to an optimal voltage. For example, square wave frequency f1=optimal voltage X k, where k is a number of cycles per 1 second such as $10^3$, $10^4$, and the like. Optionally, the ASIC may use path $106_2$ to provide a reference clock to the voltage regulator. The reference clock is utilized to compensate for any time/frequency measurement error between the ASIC and the voltage regulator In one or more embodiments, the frequency of the reference clock provided by the signal reference may be 10 KHz. When this frequency is compared to the modulated frequency (e.g., 3.4 KHz), the modulation factor (e.g., 3.4) is determined. The modulation factor indicates the optimal voltage (e.g., 3.4 volts). Of course, the modulation factor (i.e., the signal characteristic) can be mapped to any number to indicate a voltage level. In another embodiment, a duty cycle of the signal may indicate the voltage level. By the way of example and not as a limitation, the ASIC may provide a square wave signal that has frequency proportional to optimal voltage and duty cycle, $V_{out}$=M X duty cycle. The duty cycle may be any value between 0% and 100%. For example, 50% duty cycle may correspond to 10.0 (M=50) and 5% duty cycle (M=5) may correspond to 1.0 V.

At step 306, the repeating signal is sent to the voltage regulator to identify a second voltage level (the optimal voltage level) to apply the ASIC.

At step 308, the signal processor analyzes the signal to determine the voltage level to be established. In response to the analysis, the voltage controller adjusts the first voltage level that was used to "power up" the ASIC to the second voltage level to power the ASIC during operation.

The method 300 ends at step 310. Alternatively, the method 300 and/or some portion thereof (e.g., steps 306, 308) may be repeated periodically, in continuous fashion, or upon being triggered as a result of a condition, such as the ASIC needing to change to one or more voltage levels other than the first and/or second voltage levels. As another alternative, the method 300 and/or some portion thereof (e.g., steps 306, 308) may be repeated periodically, in continuous fashion, or upon being triggered as a result of a condition, so as to cause the ASIC to return to the first or second voltage levels after being at other voltage levels.

Variations of the method and apparatus described above are possible without departing from the scope of the invention. In view of the wide variety of embodiments that can be applied, it should be understood that the illustrated embodiments are exemplary only, and should not be taken as limiting the scope of the following claims.

What is claimed is:

1. An apparatus comprising:
   an Application Specific Integrated Circuit (ASIC) having a signal source and a modulator, wherein the modulator is configured to impose a modulation on a signal produced by the signal source in order to establish a characteristic of the signal that indicates a voltage level to be used to power the ASIC;
   a voltage regulator including a signal processor and a voltage controller; and
   a power bus coupling the voltage regulator to the ASIC;
   wherein the voltage regulator is coupled to receive the signal from the ASIC, the signal processor is configured to analyze the signal from the ASIC for the characteristic to determine the voltage level for operation of the ASIC, and based on the characteristic, the voltage controller is configured to adjust the voltage level for power supplied over a power bus coupling the voltage regulator to the ASIC.

2. The apparatus of claim 1, wherein the signal source is configured to generate the signal as a repeating signal.

3. The apparatus of claim 1, wherein the modulator is configured to impose a frequency modulation on the signal produced by the signal source to establish the characteristic.

4. The apparatus of claim 3, wherein the modulator is configured to impose the frequency modulation on the signal produced by the signal source according to a product of a frequency and a modulation factor to establish the characteristic, where the modulation factor represents the voltage level of power to be supplied to the ASIC.

5. The apparatus of claim 1, wherein the modulator is configured to impose a modulation on the signal produced by the signal source to establish a duty cycle as the characteristic.

6. The apparatus of claim 5, wherein the modulator is configured to impose a modulation on the signal produced by the signal source according to a product of the duty cycle and a modulation factor to establish the characteristic, where the modulation factor represents the voltage level.

7. The apparatus of claim 6, wherein the modulator is configured to set the modulation factor to establish a duty cycle in a range between 0% to 100%.

8. The apparatus of claim 1, further comprising a single conductor coupling the signal from the ASIC to the voltage regulator.

9. The apparatus of claim 1, wherein the modulator is configured to impose a modulation on the signal so that the characteristic is time invariant.

10. The apparatus of claim 1, wherein the modulator is configured to impose a modulation on the signal so that the characteristic is time variant.

11. The apparatus of claim 1, wherein the ASIC comprises a signal reference that is configured to generate a reference clock that is supplied to the voltage regulator, and wherein the signal processor of the voltage regulator uses the reference clock in analyzing the signal to determine the characteristic indicative of the voltage level for the power to be supplied to the ASIC.

12. The apparatus of claim 11, wherein the reference clock and the signal are coupled to the voltage regulator via two conductors.

13. The apparatus of claim 1, wherein the signal processor analyzes the signal to determine the voltage level which is a voltage level for efficiently operating the ASIC.

14. A method comprising:
coupling a power bus between an Application Specific Integrated Circuit (ASIC) and a voltage regulator;
applying power on the power bus at a first voltage level to the ASIC from the voltage regulator;
sending a repeating signal on a conductor from the ASIC to the voltage regulator, wherein the repeating signal is modulated to establish a characteristic that identifies a second voltage level to be used for powering the ASIC; and
at the voltage regulator, analyzing the repeating signal to determine the characteristic that identifies the second voltage level and adjusting the power supplied on the power bus to the ASIC to the second voltage level based on the characteristic determined from the signal.

15. The method of claim 14, wherein the second voltage level is a voltage level for efficiently operating the ASIC.

16. The method of claim 14, wherein the characteristic is a frequency of the repeating signal.

17. The method of claim 14, wherein the characteristic is a duty cycle of the repeating signal.

18. The method of claim 14, wherein sending comprises sending the repeating signal over a single conductor from the ASIC to the voltage regulator.

19. The method of claim 14, further comprising:
at the ASIC, generating a reference signal; and
sending the reference signal to the voltage regulator to be used by the voltage regulator in combination with the repeating signal to determine the characteristic.

20. The method of claim 19, wherein sending the repeating signal and sending the reference signal comprise sending the repeating signal over a first conductor and sending the reference signal over a second conductor.

21. The method of claim 14, wherein analyzing comprises analyzing the signal to determine the voltage level which is a voltage level for efficiently operating the ASIC.

22. The method of claim 14, and further comprising the ASIC generating a reference clock that is supplied to the voltage regulator, and the voltage regulator analyzing the signal using the reference clock to determine the characteristic indicative of the voltage level for the power to be supplied to the ASIC.

23. The method of claim 22, and further comprising supplying the reference clock and the signal to the voltage regulator via two conductors.

* * * * *